(12) United States Patent
Yanli

(10) Patent No.: US 9,728,895 B2
(45) Date of Patent: Aug. 8, 2017

(54) BUSBAR CONNECTOR ASSEMBLY

(71) Applicant: SCHNEIDER ELECTRIC IT CORPORATION, West Kingston, RI (US)

(72) Inventor: Zhang Yanli, Shanghai (CN)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 0 days.

(21) Appl. No.: 15/112,541

(22) PCT Filed: Jan. 20, 2014

(86) PCT No.: PCT/CN2014/070911
§ 371 (c)(1),
(2) Date: Jul. 19, 2016

(87) PCT Pub. No.: WO2015/106454
PCT Pub. Date: Jul. 23, 2015

(65) Prior Publication Data
US 2016/0336688 A1    Nov. 17, 2016

(51) Int. Cl.
H01R 13/631 (2006.01)
H01R 25/14 (2006.01)
H01R 43/26 (2006.01)
H01R 101/00 (2006.01)

(52) U.S. Cl.
CPC ....... *H01R 13/6315* (2013.01); *H01R 25/142* (2013.01); *H01R 43/26* (2013.01); *H01R 2101/00* (2013.01)

(58) Field of Classification Search
CPC .. H01R 13/6315; H01R 25/142; H01R 43/26; H01R 101/00
USPC ......................................... 439/11, 31, 13, 24
See application file for complete search history.

(56) References Cited

U.S. PATENT DOCUMENTS

| | | | | |
|---|---|---|---|---|
| 3,857,625 A | * | 12/1974 | Crane ................. | E05D 11/0081 16/223 |
| 3,860,312 A | * | 1/1975 | Gordon, Jr. ............ | H01R 39/64 439/31 |
| 5,395,248 A | * | 3/1995 | Kinoshita .............. | H01R 35/04 439/31 |

(Continued)

FOREIGN PATENT DOCUMENTS

| | | |
|---|---|---|
| CN | 102510033 A | 6/2012 |
| CN | 102953091 A | 3/2013 |
| EP | 2511993 A2 | 10/2012 |

OTHER PUBLICATIONS

Notification of Transmittal of the International Search Report and the Written Opinion of the International Searching Authority from corresponding PCT/CN2014/070911 dated Oct. 22, 2014.

*Primary Examiner* — Alexander Gilman
(74) *Attorney, Agent, or Firm* — Lando & Anastasi, LLP

(57) ABSTRACT

A busbar connector assembly includes a dynamic head configured to be secured to one of a busbar and an electronic device, a static head configured to be secured to the other of the busbar and the electronic device, and a connector configured to flexibly secure the dynamic head and the static head so that the dynamic head is capable of moving relative to the static head. Other aspects of the busbar connector assembly and methods of connecting an electronic device to a busbar are further disclosed.

15 Claims, 12 Drawing Sheets

(56) References Cited

U.S. PATENT DOCUMENTS

| | | | |
|---|---|---|---|
| 6,497,580 B2 * | 12/2002 | Watanabe | H05K 7/1439 439/31 |
| D482,655 S * | 11/2003 | Higuchi | D13/133 |
| 7,394,650 B2 * | 7/2008 | Zaderej | G06F 1/1616 16/267 |
| 8,753,129 B2 * | 6/2014 | Worley | H01R 13/04 439/31 |
| 8,905,764 B2 * | 12/2014 | Cheng | H01R 35/00 439/24 |
| 8,986,017 B2 * | 3/2015 | Borg | H01R 39/64 310/232 |
| 9,072,191 B2 | 6/2015 | Silberbauer et al. | |
| 2008/0101052 A1 * | 5/2008 | Lee | H04M 1/0216 361/814 |

\* cited by examiner

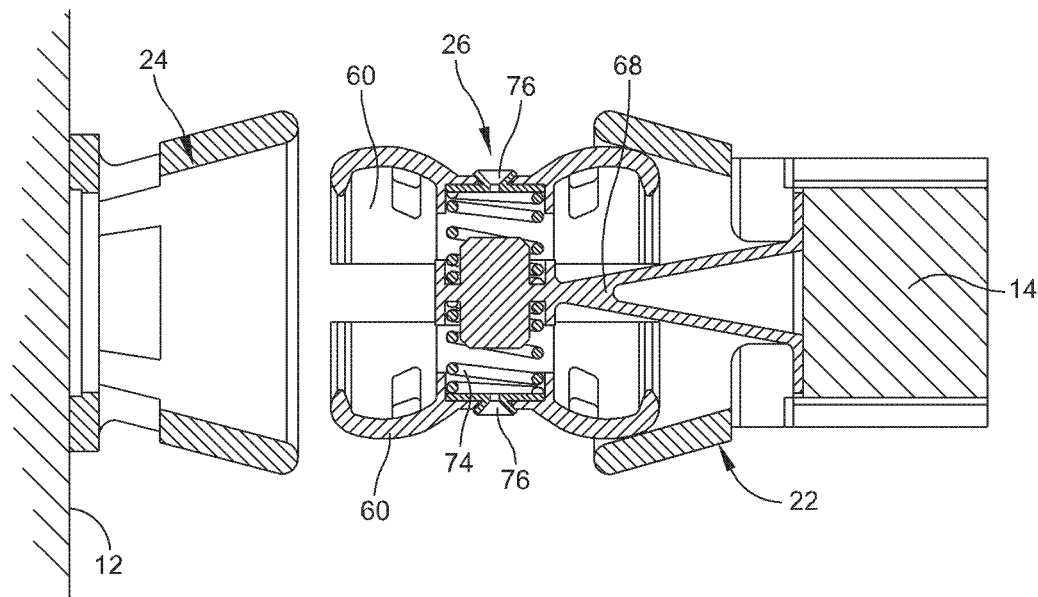
FIG. 4
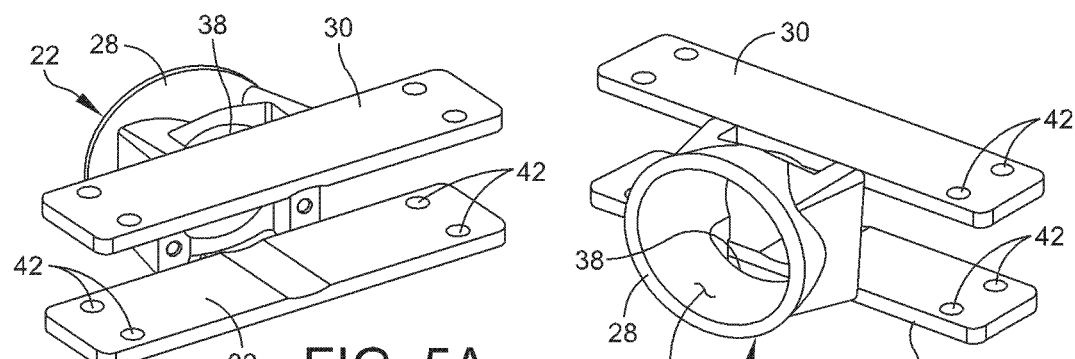
FIG. 5A
FIG. 5B
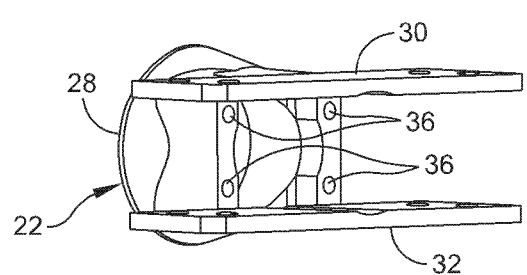
FIG. 5C

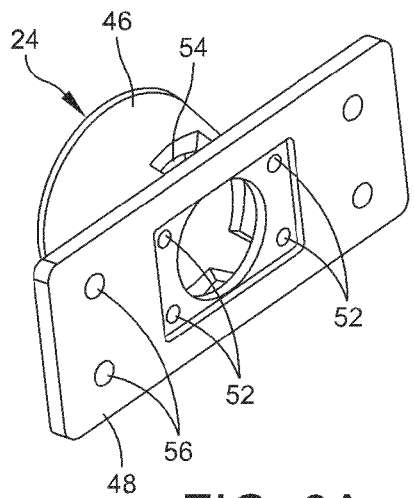
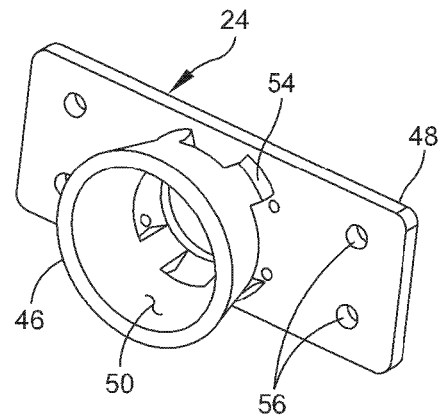
FIG. 6A  FIG. 6B
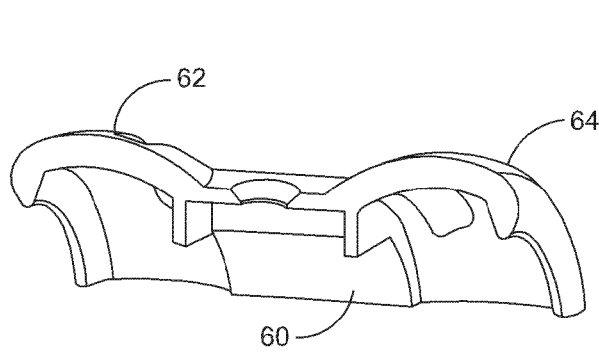
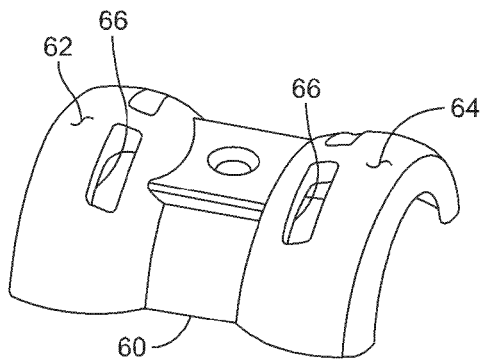
FIG. 7A  FIG. 7B
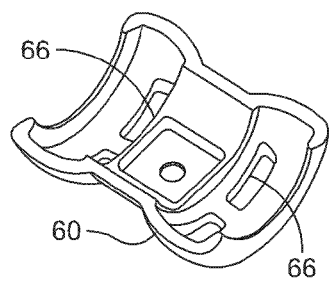
FIG. 7C

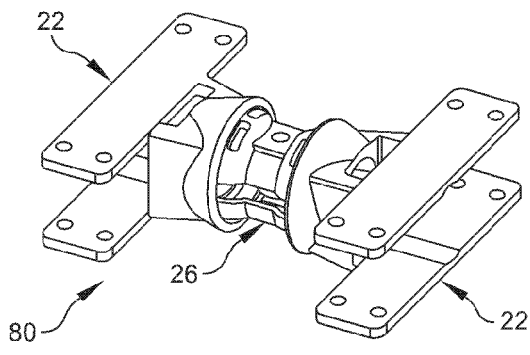
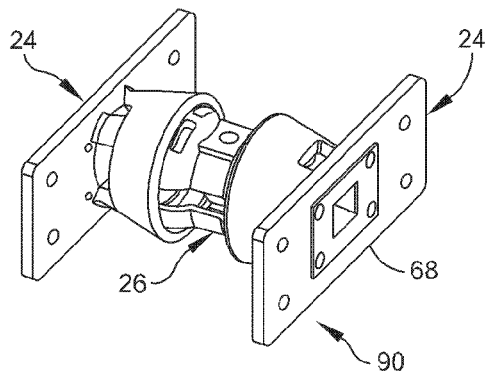
FIG. 11   FIG. 12
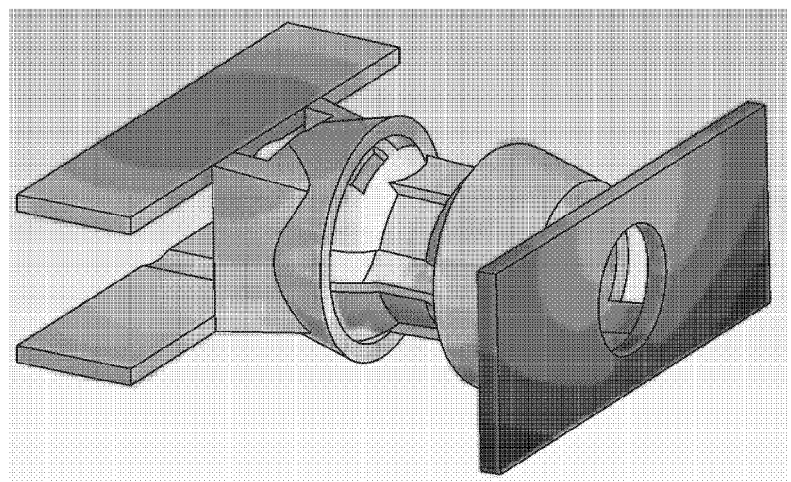
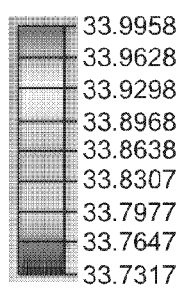
FIG. 13

BUSBAR CONNECTOR ASSEMBLY

CROSS-REFERENCE TO RELATED APPLICATIONS

This application is a U.S. National Stage Application under 35 U.S.C. §371 of International Application No. PCT/CN2014/070911, filed Jan. 20, 2014, titled BUSBAR CONNECTOR ASSEMBLY, which is hereby incorporated herein by reference in its entirety.

BACKGROUND OF DISCLOSURE

1. Field of Disclosure

Embodiments of the disclosure relate generally to methods and apparatus for providing uninterruptible power to sensitive and/or critical loads. More specifically, embodiments of the disclosure relate to racks used to house components of uninterruptible power supplies and to connectors used to connect power equipment within the racks.

2. Discussion of Related Art

Centralized data centers for computer, communications and other electronic equipment have been in use for a number of years, and more recently, with the increasing use of the Internet, large scale data centers that provide hosting services for Internet Service Providers (ISPs), Application Service Providers (ASPs) and Internet content providers are become increasingly popular. It is often desirable to operate equipment within data centers seven days a week, 24 hours per day, with little or no disruption in service. To prevent any disruption in service, it is common practice in data centers to use uninterruptible power supplies (UPSs) to ensure that the equipment within the data centers receives continuous power throughout any black out or brown out periods. Typically, data centers are equipped with a relatively large UPS at the main power distribution panel for the facility. Often, the UPS is selected to have sufficient capacity to meet the power requirements for all of the equipment within the facility.

FIG. 1A illustrates a well known connector, generally indicated at 10, used to connect power equipment 12, such as a power module, to a busbar 14. The capability of existing connectors to carry large currents is limited, such as 330 Amps (A), for the connector 10 illustrated in FIG. 1A. Such connectors are incapable of carrying higher current levels, such as adapting 100 kA short circuit. As shown, the existing connector 10 includes a thin body, which limits the capability of the connector to carry current due to a very short contact line with the busbar caused by the thin body. This short contact line further results in very high temperatures at contact areas between the connector 10 and the busbar 14, which is illustrated in FIG. 1B. These high temperatures corrode the connector above the contact line very quickly, with the corroded areas being more susceptible to increased temperatures.

Another disadvantage of existing connectors is that when being secured to the busbar, the connector needs to provide suitable pressure to ensure a secure connection. The connector includes a spring steel clip positioned at a contact point. With spring steel clips, it is difficult to determine whether the pressure is sufficient. The existing connectors also suffer from difficulty in dissipating heat from the contact areas.

SUMMARY OF DISCLOSURE

One aspect of the present disclosure is directed to a busbar connector assembly comprising a dynamic head configured to be secured to one of a busbar and an electronic device, a static head configured to be secured to the other of the busbar and the electronic device, and a connector configured to flexibly secure the dynamic head and the static head so that the dynamic head is capable of moving relative to the static head.

Embodiments of the busbar connector assembly may include configuring the dynamic head to have a cone-shaped annular portion and two spaced apart bars secured to the annular portion and configured to be secured to the busbar. The annular portion may have a cutout formed therein for ventilation. The two spaced apart bars may extend in a direction that is perpendicular to a longitudinal direction of the cone-shaped annular portion. The spaced apart bars may have openings formed therein to secure the spaced apart bars to the busbar. The static head may include a cone-shaped annular portion and a connector portion configured to be secured to the electronic device. The connector portion of the static head may extend along a plane that is perpendicular to an axis of the cone-shaped annular portion. The connector portion may have openings formed therein to secure the connector portion to the electronic device. The connector may include an adaptive connector configured to be received within the cone-shaped annular portions of the dynamic head and the static head. The adaptive connector may have a first end configured to be received within the cone-shaped annular portion of the dynamic head and a second end configured to be received within the cone-shaped annular portion of the static head. The adaptive connector may have a cutout formed therein for ventilation. The connector further includes a spring bracket secured to the dynamic head and the adaptive connector, and a spring disposed within the spring bracket. The spring bracket may have a first portion configured to be secured to the dynamic head and a second portion configured to be secured to the adaptive connector. The spring may be disposed within a central portion of the adaptive connector and around the second portion of the spring bracket. The connector further may include two smaller brackets configured to be secured within the central portion of the adaptive connector. One smaller bracket may engage one end of the spring and the other smaller bracket engages an opposite end of the spring.

Another aspect of the disclosure is directed to a method for securing an electronic device to a busbar. In one embodiment, the method comprises: securing a busbar connector assembly to the electronic device, the busbar connector assembly including a dynamic head, a static head configured to be secured to the electronic device, and a connector configured to flexibly secure the dynamic head and the static head; and securing the dynamic head to the busbar, the dynamic head being capable of moving relative to the static head.

Embodiments of the method may include, when securing the dynamic head to the busbar, sliding the electronic device and the busbar connector assembly toward the busbar. The dynamic head may include a cone-shaped annular portion and two spaced apart bars secured to the annular portion and configured to be secured to the busbar. The static head may include a cone-shaped annular portion and a connector portion configured to be secured to the electronic device. The connector may include an adaptive connector configured to be received within the cone-shaped annular portions of the dynamic head and the static head, a spring bracket secured to the dynamic head and the adaptive connector, and a spring disposed within the spring bracket.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 4 is an enlarged cross-sectional view of the busbar connector assembly;

FIGS. 5A-5C are perspective views of a dynamic head of the busbar connector assembly;

FIGS. 6A and 6B are perspective views of a static head of the busbar connector assembly;

FIGS. 7A-7C are perspective views of an adaptive connector sub-assembly of the busbar connector assembly;

FIG. 11 is a perspective view of a busbar connector assembly of another embodiment of the disclosure;

FIG. 12 is a perspective view of a busbar connector assembly of yet another embodiment of the disclosure;

FIGS. 13-18 are thermal images of the busbar connector assembly shown in FIGS. 2-10;

DETAILED DESCRIPTION

Figure 1A:
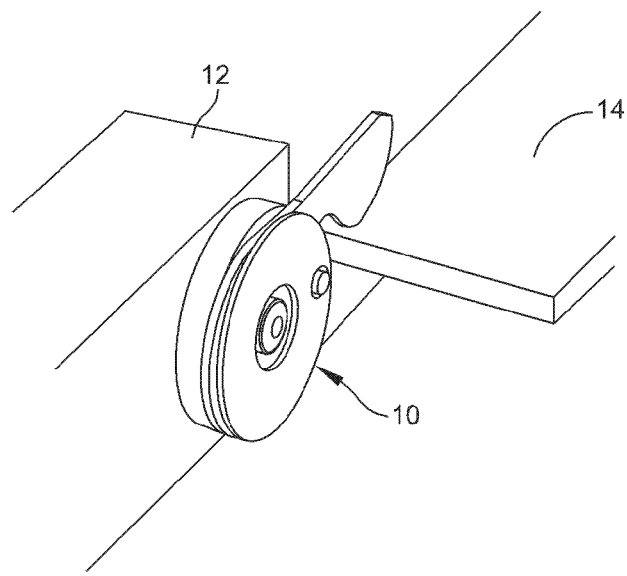
FIG. 1A is a perspective view of a prior art connector.

This disclosure is not limited in its application to the details of construction and the arrangement of components set forth in the following description or illustrated in the drawings. The principles set forth in this disclosure are capable of being provided in other embodiments and of being practiced or of being carried out in various ways. Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

Uninterruptible power supplies are used to provide conditioned and continuous power to equipment provided within data centers, especially throughout any black out or brown out periods. As mentioned above, data centers are equipped with relatively large UPSs at the main power distribution panel for the facility. In certain embodiments, a configurable rack in the form of an uninterruptible power supply includes a frame assembly having a front frame defining a front of the configurable rack, a rear frame defining a rear of the configurable rack, and side frame members that connect the front frame to the rear frame. The frame assembly is a box-shaped structure having, in addition to the front and back, two sides, a top and a bottom. The front frame and the rear frame are each configured to receive electronic modules in stacked relation along a height of the frame. In certain embodiments, the modules may be rack-mounted or mounted on rails or slides within the interior of the frame assembly. The configurable rack may include power modules and batteries to form an uninterruptible power supply, and other pieces of equipment required to operate the uninterruptible power supply. These modules are rack-mounted in the well-known manner.

Busbars may be used to provide power to the modules positioned within the configurable rack. Busbars are also used in many electrical power distribution devices, such as power modules, switching apparatus, distribution apparatus, and batteries. In certain embodiments, the busbar may be configured as a strip or bar of conductive material, such as copper, aluminum, or brass. A primary purpose of the busbar is to conduct electricity. A cross-sectional size of the busbar may be selected to determine a maximum amount of current that can be safely carried. Busbars can be configured to small or large cross-sectional areas. Busbars are typically either flat strips or hollow tubes as these shapes allow heat to dissipate more efficiently due to their high surface area to cross-sectional area ratio. Reference can be made to U.S. Patent Application Publication No. 2012/0170175 A1, which discloses a configurable rack having a busbar backplane to provide power to modules positioned within the configurable rack.

Figure 2:
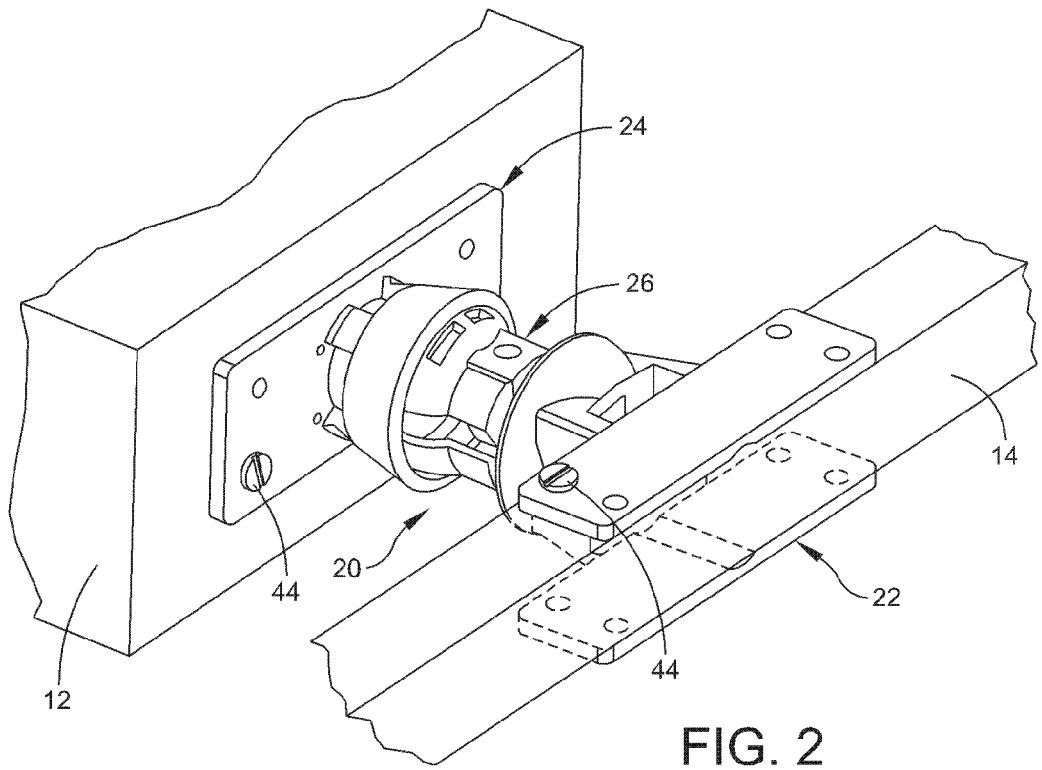
FIG. 2 is perspective view of a busbar connector assembly of an embodiment of the present disclosure.

Referring to the drawings, and more particularly to FIG. 2, a busbar connector assembly of one embodiment of the present disclosure is generally indicated at 20. As shown, the busbar connector assembly 20 includes a dynamic head, generally indicated at 22, which is configured to be secured to the busbar 14, and a static head, generally indicated at 24, which is configured to be secured to the electronic device 12. In the shown embodiment, the dynamic head 22 is secured to the busbar 14 and the static head 24 is secured to a power device 12, such as a power module. Although the dynamic head 22 is shown and described as being connected to the busbar 14 and the static head 24 is shown and described as being connected to the electronic device 12, the component parts of the busbar connector assembly can be configured so that the dynamic head is connected to the electronic device and the static head is connected to the busbar. In one embodiment, the dynamic head 22 and the static head 24 are fabricated from a conductive material, such as copper, so that electricity and heat are conducted through the respective heads. Other suitable conductive materials alternatively may be employed. The busbar connector assembly 20 is designed to provide flexibility when attaching the electronic device to the busbar and to reduce temperature hot spots provided at the contact areas of the busbar connector assembly and the busbar.

Figure 3:
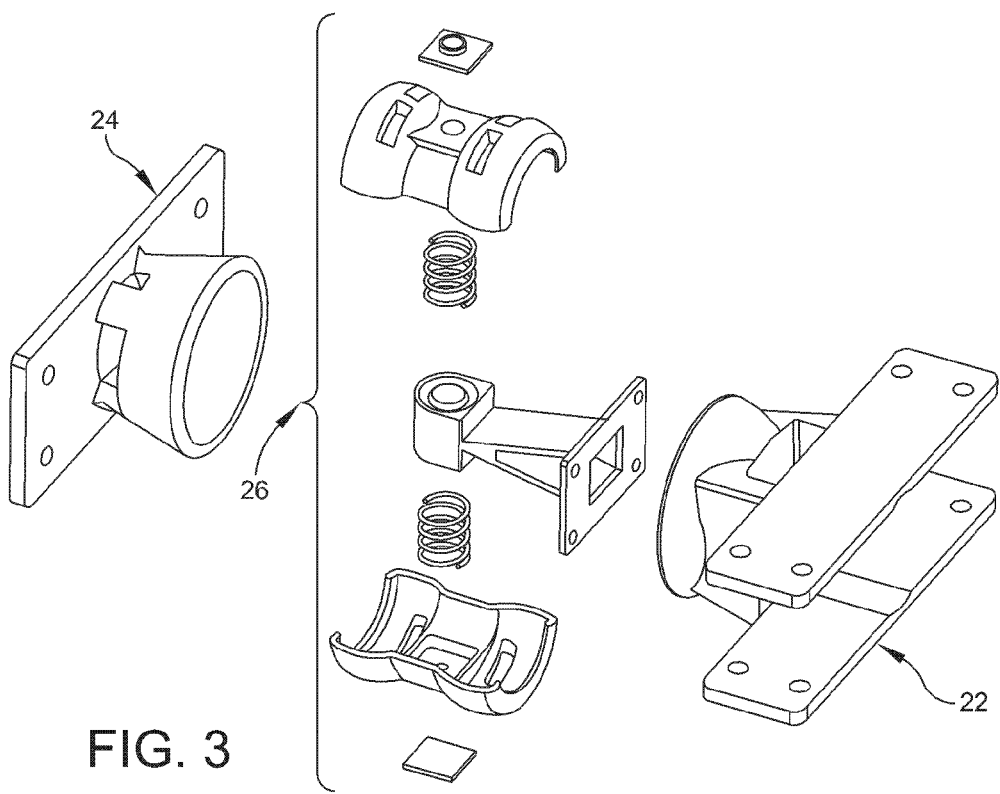
FIG. 3 is an exploded perspective view of the busbar connector assembly.

Referring additionally to FIGS. 3 and 4, the busbar connector assembly 20 further includes an adaptive connector sub-assembly, generally indicated at 26, which is configured to flexibly secure the dynamic head 22 and the static head 24 so that the dynamic head is capable of moving or flexing relative to the static head. The adaptive connector sub-assembly 26 enables the relative up-and-down movement between the electronic device 12 and the busbar 14, which can be helpful when connecting the electronic device to the busbar. Also, the adaptive connector sub-assembly 26, as well as the dynamic head 12 and the static head 14, provides a more homogeneous thermal transfer of heat from the busbar 14 to electronic device 12 and vice versa at the contact areas. The description of the adaptive connector sub-assembly 26 will be described in greater detail as the description of the busbar connector assembly 10 proceeds.

Referring to FIGS. 5A-5C, the dynamic head 22 includes a body having a cone-shaped annular portion 28 and two spaced apart bars 30, 32 secured to the annular portion and configured to be secured to the busbar 14. The annular portion 28 of the dynamic head 22 includes a funnel surface 34 that is designed to receive a portion of the adaptive connector sub-assembly 26 in the manner described in greater detail below. The annular portion 28 of the dynamic head 22 includes four small openings, each indicated at 36, formed therein that are utilized to secure the portion of the adaptive connector sub-assembly 26 to the annular portion of the dynamic head, if necessary. As shown, there are two cutouts, each indicated at 38, formed in the annular portion 28 of the dynamic head 22 near the two spaced apart bars 30, 32 for ventilation. These cutouts 38 are formed on opposite sides of the annular portion 28 of the dynamic head 22.

In one embodiment, the two spaced apart bars 30, 32 extend in a direction that is perpendicular to a longitudinal direction of the cone-shaped annular portion 28. As will be shown with reference to FIGS. 11 and 12 below, the bars 30, 32 may be replaced by another connector part to attach the dynamic head 22 to a device other than the busbar. Each bar 30, 32 has openings, each indicated at 42, formed therein to secure the spaced apart bars to the busbar 14. In the shown embodiment, there are four openings 42 formed in each bar 30, 32; however, any number of openings may be formed in one or both bars. Referring back to FIG. 2, the busbar 14 is received within the spaced apart bars 30, 32, and the busbar may be secured to the bars by fasteners, such as fastener 44.

Referring to FIGS. 6A and 6B, the static head 24 includes a body having a cone-shaped annular portion 46 and a connector plate 48 configured to be secured to the electronic device 12. The annular portion 46 of the static head 24 includes a funnel surface 50 that is designed to receive another portion of the adaptive connector sub-assembly 26 in the manner described in greater detail below. A back surface of the connector plate 48 of the static head 24 includes four small openings, each indicated at 52, formed therein that are utilized to secure the other portion of the adaptive connector sub-assembly 26 to the annular portion 28 of the static head, if necessary. As shown, there are four cutouts, each indicated at 54, formed in the annular portion of the static head near the connector plate 48 for ventilation. These cutouts 54 are formed equidistant from one another along a circumference of the annular portion 46 of the static head 24.

Figure 1B:
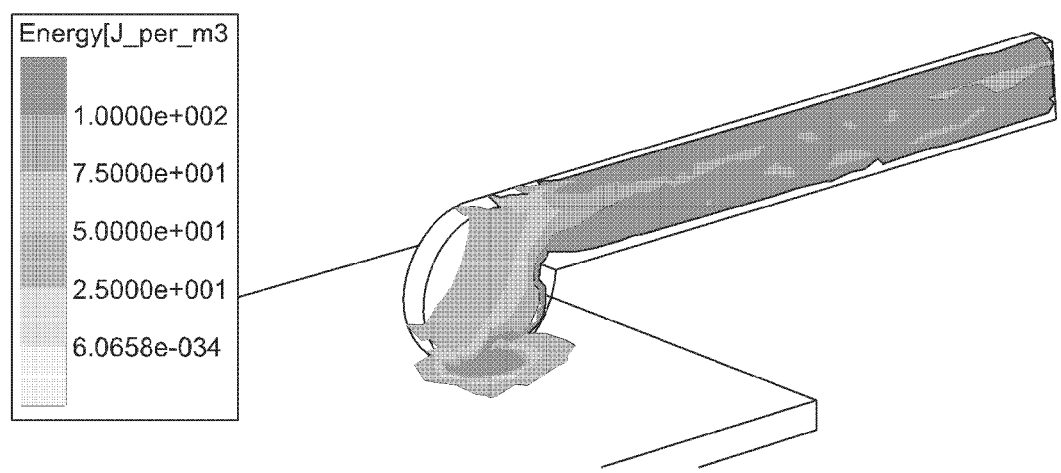
FIG. 1B is a thermal image of the prior art connector shown in FIG. 1A during use.

In one embodiment, the connector plate 48 of the static head 24 extends along a plane that is perpendicular to an axis of the cone-shaped annular portion 46 of the static head. As will be shown with reference to FIGS. 11 and 12 below, the connector plate 48 may be replaced by another connector part to attach the static head 24 to a device other than the electronic device. The connector plate 48 has openings, each indicated at 56, formed therein to secure the connector plate to the electronic device 12. In the shown embodiment, there are four openings 56 formed in the connector plate 48; however, any number of openings may be formed in the connector plate depending on the particular application. The connector plate 48 may be secured to the electronic device by fasteners, such as fastener 44 shown in FIG. 1.

As shown in FIGS. 3 and 4, the adaptive connector sub-assembly 26 includes a split body having two connector halves, each indicated at 60, which are configured to engage annular portions 28, 46 of the dynamic head 22 and the static head, respectively. Referring additionally to FIGS. 7A-7C, each connector half 60 of the split body has one end having an arcuate surface 62 and an opposite end having an arcuate surface 64. The arcuate surfaces 62 of the upper connector half has ventilation cutouts, each indicated at 66, formed therein to ventilate heat from the busbar connector assembly 10. As shown best in FIG. 4, the right-hand arcuate surfaces 64 of the upper and the lower connector halves 60 are received within the funnel surface 34 of the annular portion 28 of the dynamic head 22. Similarly, the left-hand arcuate surfaces 62 of the upper and the lower connector halves 60 are received within the funnel surface 50 of the annular portion 46 of the static head 22. In one embodiment, the upper and lower connector halves 60 of the split body of the adaptive connector sub-assembly 26 may be fabricated from copper or a suitable copper alloy. Other suitable conductive materials alternatively may be employed.

Figure 8A:
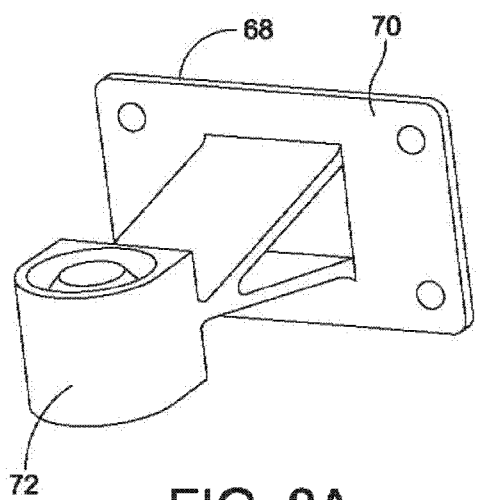
FIGS. 8A and 8B are perspective views of a spring bracket of the busbar connector assembly.
Figure 8B:
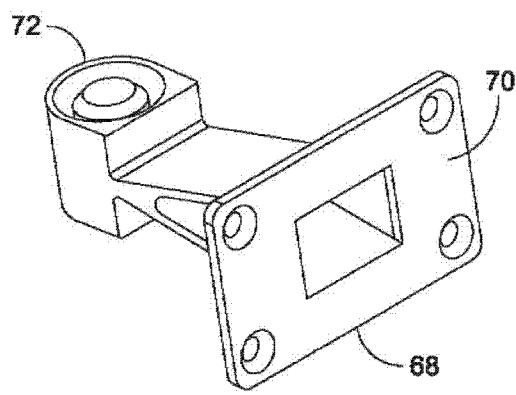

Referring additionally to FIGS. 8A and 8B, the adaptive connector sub-assembly 26 further includes a spring bracket 68 that is secured to the dynamic head 22. Specifically, the spring bracket 68 has a first portion 70 configured to be secured to the connector plate 48 of the dynamic head 22. Suitable fasteners may be used to secure the first portion 70 of the spring bracket 68 to the connector plate 48 via the small openings 52, which may be tapped. The spring bracket further has a second portion 72 configured to be secured or captured by the upper and lower connection halves 60 of the split body. In one embodiment, the spring bracket 68 may be fabricated from steel or a steel alloy.

Figure 9:
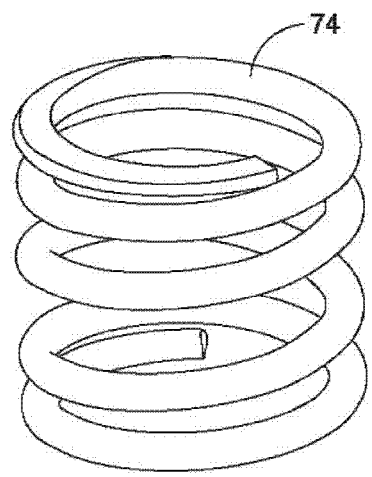
FIG. 9 is a perspective view of a spring of the busbar connector assembly.

Referring additionally to FIG. 9, the adaptive connector sub-assembly 26 further includes a spring 74 disposed within the spring bracket 68. The spring 74 is disposed within a central portion defined between the two ends of the upper and lower connection halves 60 and around the second portion 72 of the spring bracket 68. In one embodiment, the spring 74 may be fabricated from a suitable spring steel.

Figure 10:
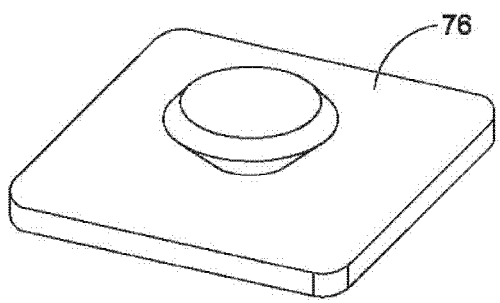
FIG. 10 is a perspective view of a smaller bracket of the busbar connector assembly.

Referring additionally to FIG. 10, the adaptive connector sub-assembly 26 further includes two smaller brackets, each indicated at 76, configured to be secured within the central portion of the upper and lower connection halves 60 of the adaptive connector sub-assembly 26. As shown, one smaller bracket 76 engages one end of the spring 74 and the other smaller bracket engages an opposite end of the spring. The smaller brackets 76 serve as an engagement surface that are applied to the ends of the spring 74 when compressing the spring by moving the upper and lower connection halves toward one another. In one embodiment, the small brackets 76 may be fabricated from steel or a steel alloy.

The arrangement is such that when the busbar connector assembly 20 is secured to the electronic device 12 by securing the connector plate 48 of the static head 24 with fasteners 44. Next the electronic device 12 and busbar connector assembly 20 are slid into place with the spaced apart bars 30, 32 of the dynamic head 22 positioned to receive the busbar 12 therein. Once in position, the dynamic head 22 is secured to the busbar 14 with fasteners 44. The adaptive connector sub-assembly 26 of the busbar connector assembly 20 enables dynamic movement of the electronic device 12 relative to the busbar 14. In addition, the components of the busbar connector assembly 20 enhance the dissipation of heat within the assembly. In one embodiment, the static head 24 of the busbar connector assembly 20 is fixed at a rear side of the electronic device 12, and the dynamic head 24 is connected to the static head by the adaptive connector sub-assembly 26. To replace an electronic device, an operator may grasp or loosen the fasteners securing the electronic device to the connector plate of the static head. In this manner, the operator will avoid contact with the busbar, which eases and safely enhances the replacement of module.

FIG. 11 illustrates a busbar connector assembly, generally indicated at 80, of another embodiment. As shown, the static head 24 of the busbar connector assembly 80 is replaced by another dynamic head 22. With this embodiment, the busbar connector assembly 80 is configured to be secured to two busbars 14, with the spring bracket 68 being secured to the right-hand dynamic head 22.

FIG. 12 illustrates a busbar connector assembly, generally indicated at 90, of yet another embodiment. As shown, the dynamic head 22 of the busbar connector assembly 90 is replaced by another static head 24. With this embodiment, the busbar connector assembly 90 is configured to be secured to two electronic devices 12, with the spring bracket 68 being secured to the right-hand static head 24. The dynamic head 22 and the static head 24 are interchangeable, with the spring bracket 68 capable of being secured to both the dynamic head and the static head.

In one embodiment, the conductive parts that have arcuate (semi-sphere) shapes and funnel shapes are configured to match with each other to carry current. In this manner, the arcuate parts are symmetrical. The parts with funnel-shaped features have both vertical and horizontal installation feasibility. The parts with arcuate- and funnel-shaped features have cutouts for ventilation.

Turning back to FIG. 1B, the temperature or thermal image of a contact line of the traditional clip connector is shown, using energy per volume instead of direct temperature because of the software. The simulation conditions includes: a use of Ansys/Maxwell software; a use of a simplified model to represent the actual 3D model in order to reduce the quantity of elements and running time; a use of 1500 Amperes (Amps); a use of very small areas instead of a "contact line" to avoid the infinite quantity during simulation; and a representation of higher energy per volume, which represents a higher possibility and quicker speed to be oxidated and corroded. Based on testing a maximum energy per volume of the traditional clip connector is 587 Joules (J)/meters$^3$ (m). The maximum energy per volume of the traditional clip connector is 97.5 J/m$^3$. The contact spot between the traditional clip connector and related busbar have a larger volume whose energy is more than 100 ($\approx$97.5) J/m$^3$. The busbar connector assembly of the present disclosure has a lower temperature on the contact spot even it has higher current (1500 Amps), thereby having a life.

Referring to FIGS. 13-18, thermal images of a contact line of the busbar connector assembly of the present disclosure are shown. The simulation conditions include: using Ansys/Icepak software; using a simplified model to represent an actual 3D model in order to reduce a quantity of elements and running time; using very small areas instead of a "contact line" to avoid an infinite quantity during simulation; using power loss from simulation in Maxwell, and allocating a power loss in every parts of new connector evenly; and subjecting the busbar connector assembly to an ambient temperature is 22° Celsius (C).

Figure 14:
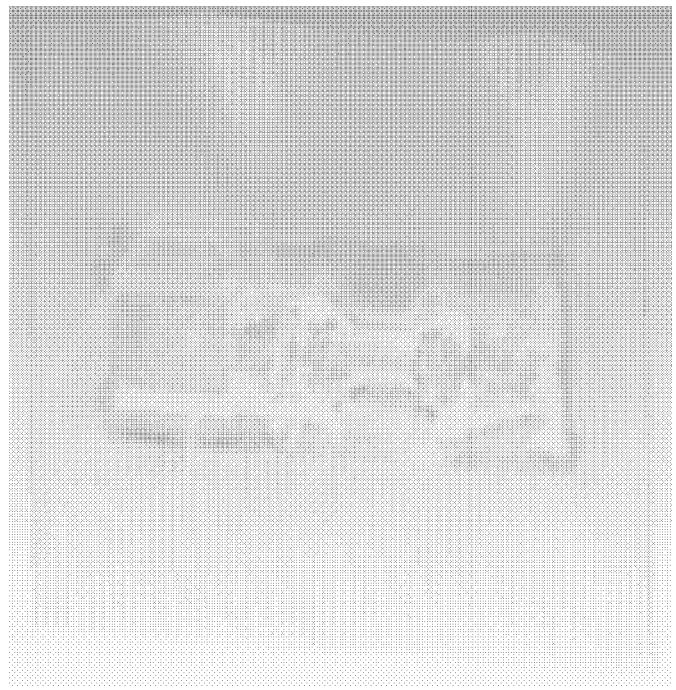
Figure 15:
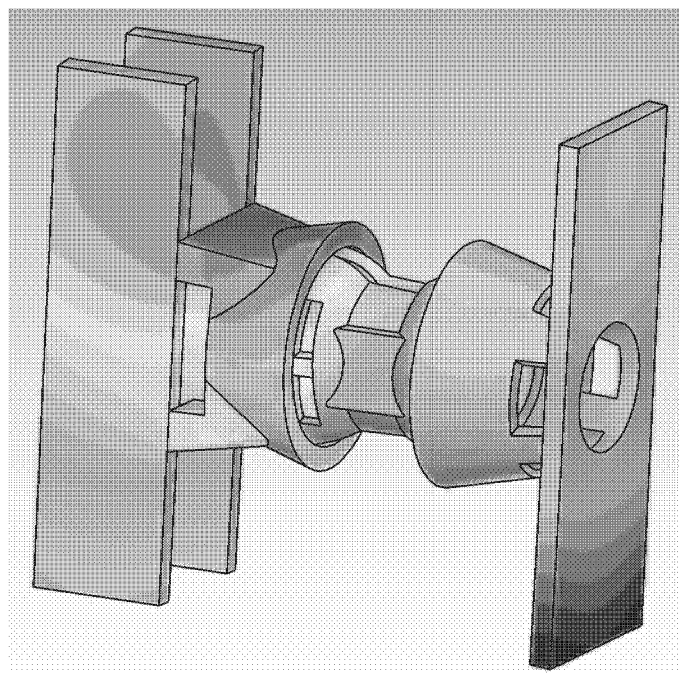
Figure 16:
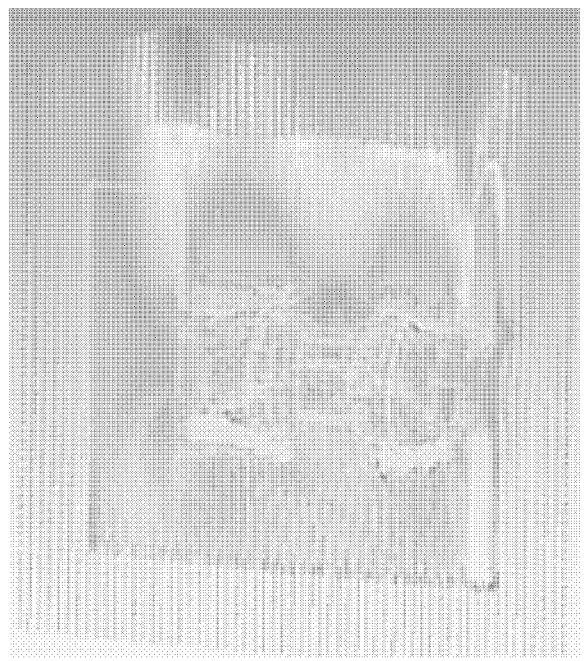
Figure 16:
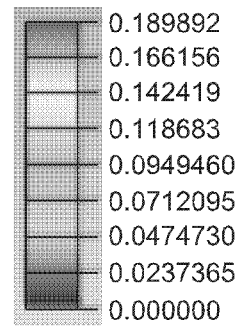
Figure 17:
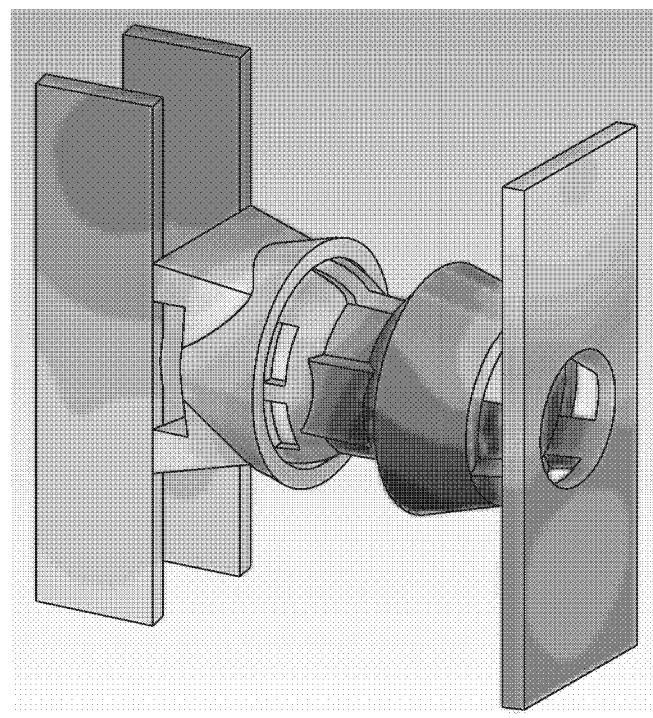
Figure 17:
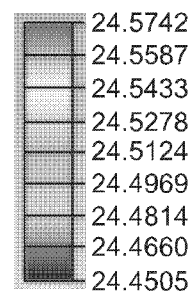
Figure 18:
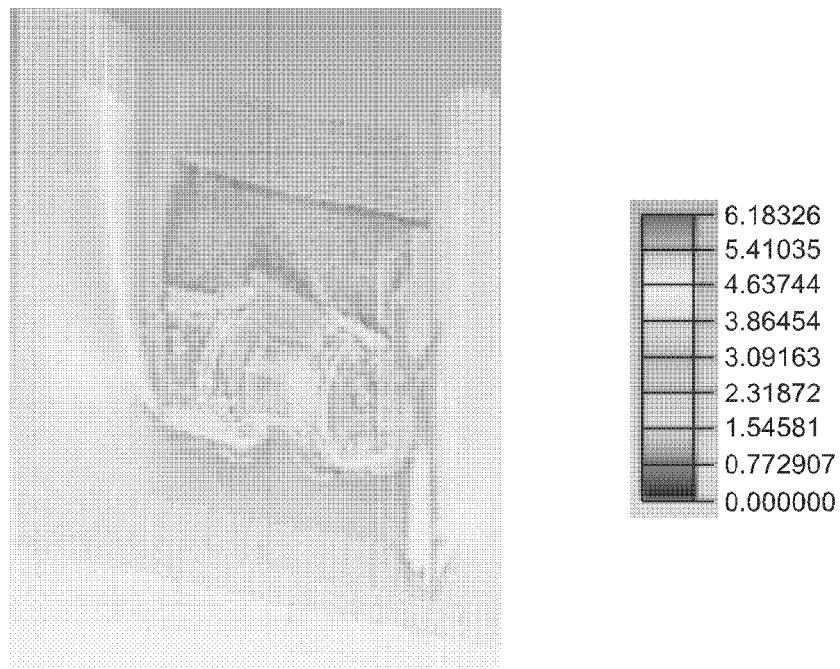

FIG. 13 illustrates the busbar connector assembly subjected to a temperature (maximum of 34° C.) in a natural convection environment at a horizontal position, and a raise in temperature of 12° C. FIG. 14 illustrates the busbar connector assembly subjected to an air speed (maximum of 0.17 m/second (s)) in a natural convection environment at a horizontal position. FIG. 15 illustrates the busbar connector assembly subjected to a temperature (maximum of 34.4° C.) in a natural convection environment at a vertical position, and a raise in temperature of 12.4° C. FIG. 16 illustrates the busbar connector assembly subjected to an air speed (maximum of 0.19 m/s) in a natural convection environment at a vertical position. FIG. 17 illustrates the busbar connector assembly subjected to a temperature (maximum of 24.6) in a forced convection environment and an inlet air speed (e.g., 4 m/s) at a vertical position, and a raise in temperature of 2.6° C. FIG. 18 illustrates the busbar connector assembly subjected to an air speed (maximum of 6.2 m/s) in a forced convection environment and an inlet air speed (e.g., 4 m/s) at a vertical position. Whether the busbar connector assembly is in a horizontal position or a vertical position within a natural convection environment, the raise in temperature is very close. When the busbar connector assembly is in a forced convection environment, the raise temperature is very limited since the busbar connector assembly has a large surface area to dissipate the heat). As shown, the busbar connector assembly is configured to dissipate heat generated by the busbar that is transferred to the electronic device.

Figure 19:
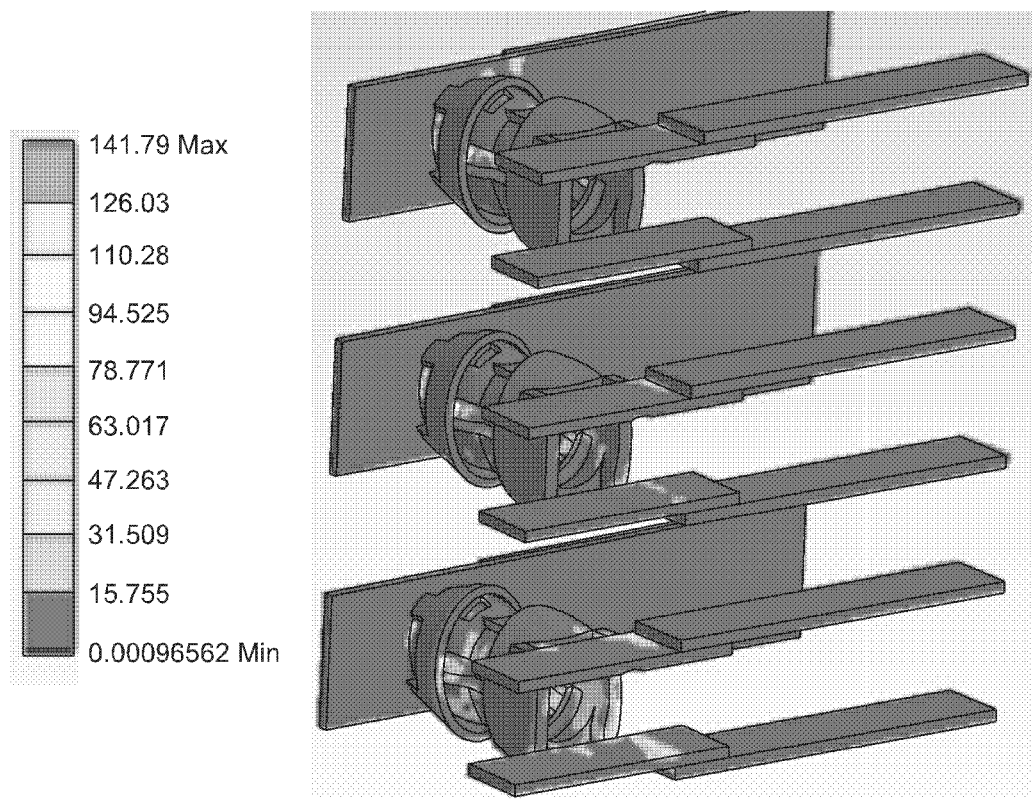
FIGS. 19 and 20 are electrodynamic force simulations showing deformation of the busbar connector assembly shown in FIGS. 2-10.
Figure 20:
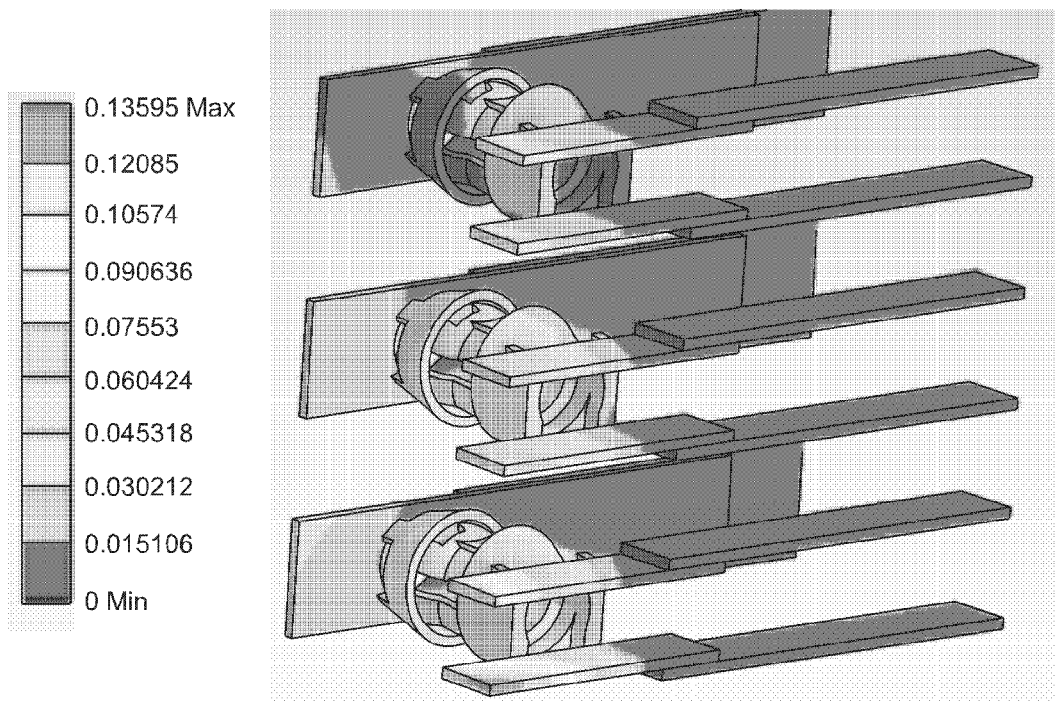

Referring to FIGS. 19 and 20, electrodynamic force simulations showing deformation of the busbar connector assembly are shown. The simulation condition includes: using Ansys/mechanical software; using a simplified model to represent an actual 3D model in order to reduce a quantity of elements and running time; using very small areas instead of a "contact line" to avoid an infinite quantity during simulation; and providing a short circuit current of 213,300 Amps, 150,000 Amps, and 63,600 Amps, respectively, in three phases.

FIG. 19 illustrates the application of a maximum tensile stress applied to the busbar connector assembly of 142 Mega Pascals (MPa), which is less than a normal copper yield strength 250 MPa. FIG. 20 illustrates a maximum deformation of the busbar connector assembly of 0.14 mm. It should be understood that the busbar connector assembly of embodiments of the present disclosure is capable of surviving a shock of 100,000 AIc short circuit. Such a short circuit current generates a large huge force between conductive parts, which can cause the conductive parts to deform severely if the design of conductive parts system is not proper (this force is sometimes called an "electrodynamic" force).

Figure 21:
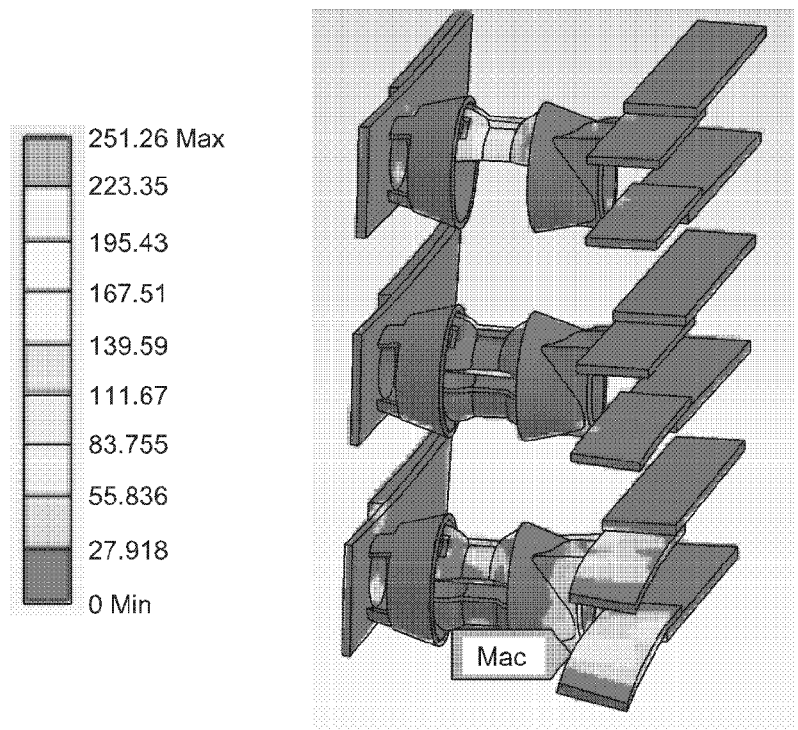
FIGS. 21 and 22 are electrodynamic force simulations showing deformation of the busbar connector assembly subjected to short circuiting.
Figure 22:
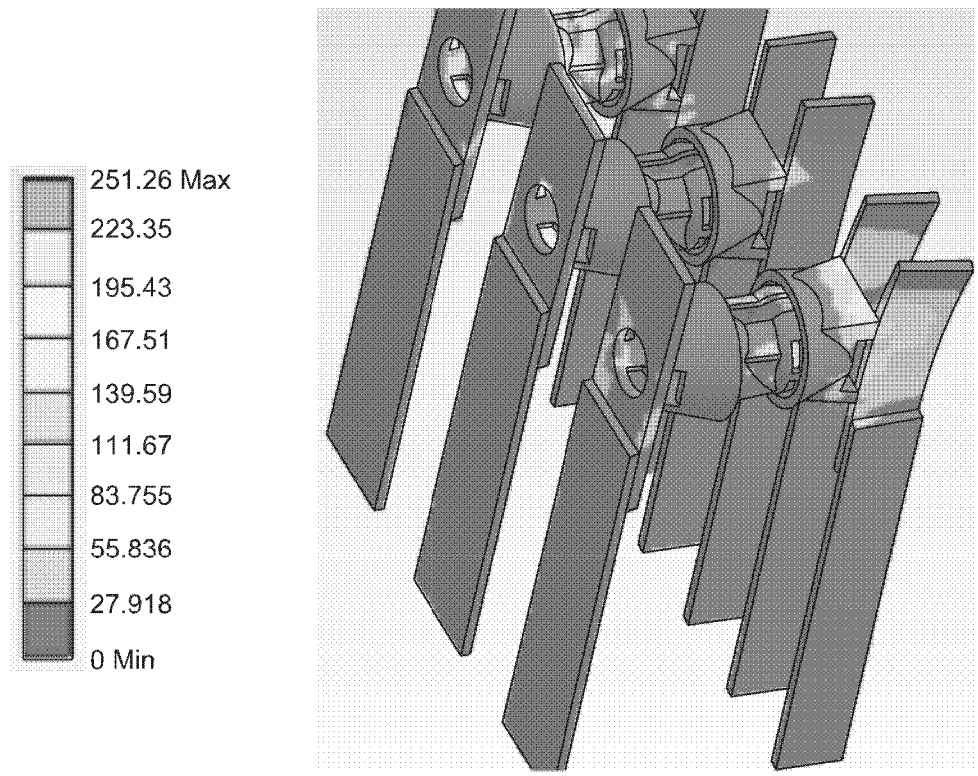

Referring to FIGS. 21 and 22, in a special application during a short circuit event, a composition of gravity/electrodynamic force/spring force may cause an upper or lower connector half of the adaptive contactor sub-assembly to disengage one or both of the dynamic and static heads, even though the moment is very brief. This means that the connector half (or halves) does not carry current. The simulation condition includes: using Ansys/mechanical software; using a simplified model to represent an actual 3D model in order to reduce a quantity of elements and running time; using very small areas instead of a "contact line" to avoid an infinite quantity during simulation; and providing a short circuit current of 213,300 Amps, 150,000 Amps, and 63,600 Amps, respectively, in three phases.

FIG. 21 illustrates the application of a maximum tensile stress applied to the busbar connector assembly of 251 MPa, which is a little more than a yield strength 250 MPa. FIG. 22 illustrates the application of a maximum tensile stress at a corner of the dynamic head, which produces little effect.

Figure 23:
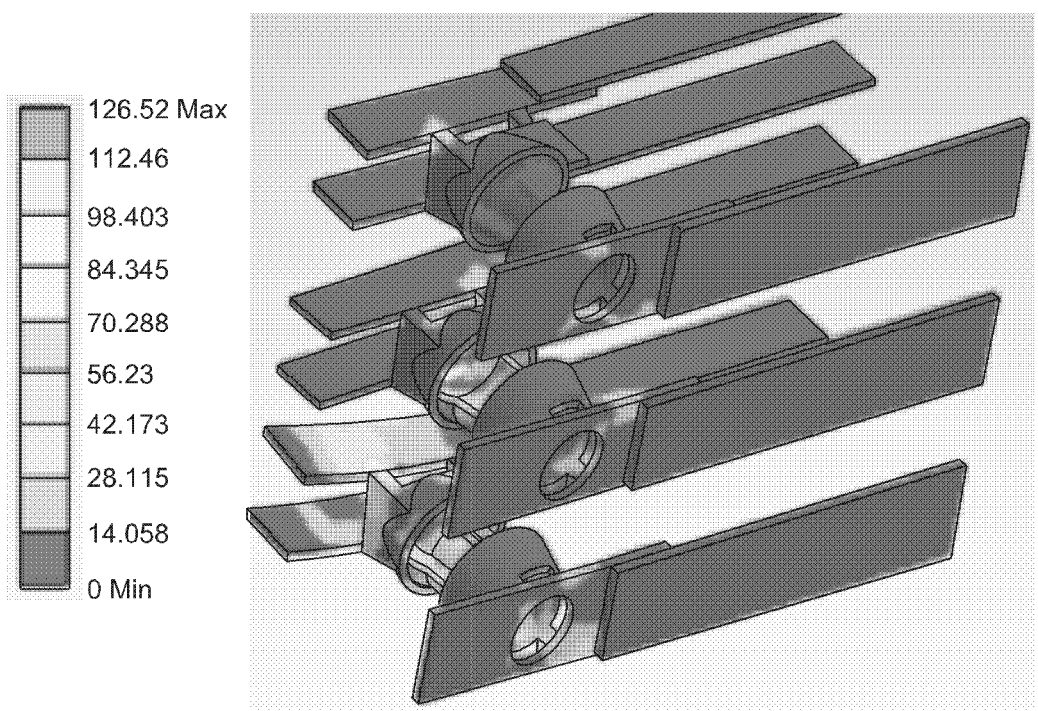
FIGS. 23 and 24 are electrodynamic force simulations showing deformation of the busbar connector assembly subjected to short circuiting of another application.
Figure 24:
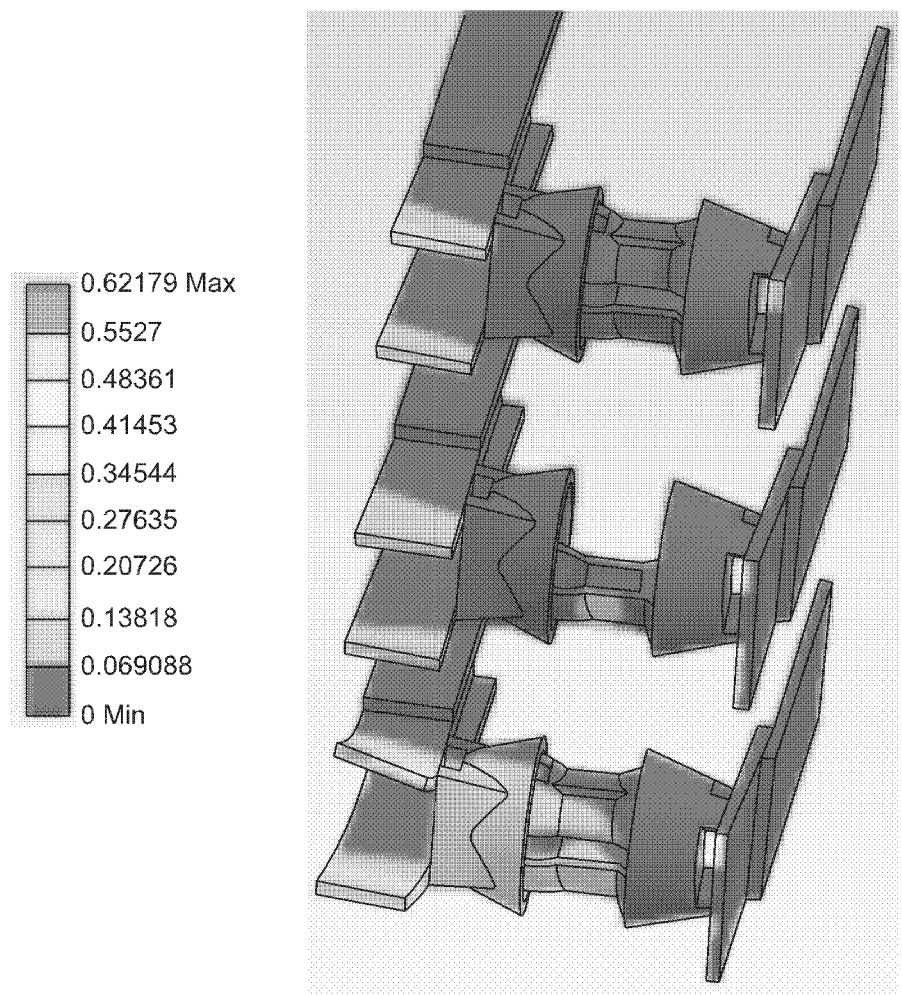

Referring to FIGS. 23 and 24, in another special application during a short circuit event, a composition of gravity/electrodynamic force/spring force may cause an upper or lower connector half of the adaptive contactor sub-assembly to disengage both the dynamic and static heads, even though the moment is very brief. This means that the connector half (or halves) does not carry current. The simulation condition includes: using Ansys/mechanical software; using a simplified model to represent an actual 3D model in order to reduce a quantity of elements and running time; using very small areas instead of a "contact line" to avoid an infinite quantity during simulation; providing a short circuit current of 213,300 Amps, 150,000 Amps, and 63,600 Amps, respectively, in three phases; and simulating a middle situation.

FIG. 23 illustrates the application of a maximum tensile stress applied to the busbar connector of 126.5 MPa, which is less than normal copper yield strength 250 MPa. FIG. 24 illustrates a maximum of 0.6 mm. Thus, the busbar connector assembly is configured to survive a shock of 100 kAIc short circuit at a particular moment.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

What is claimed is:

1. A busbar connector assembly comprising:
a dynamic head configured to be secured to one of a busbar and an electronic device;
a static head configured to be secured to the other of the busbar and the electronic device; and
a connector configured to flexibly secure the dynamic head and the static head so that the dynamic head is capable of moving relative to the static head,
wherein the dynamic head includes a cone-shaped annular portion and two spaced apart bars secured to the annular portion and configured to be secured to the busbar, and
wherein the annular portion has a cutout formed therein for ventilation.

2. A busbar connector assembly comprising:
a dynamic head configured to be secured to one of a busbar and an electronic device;
a static head configured to be secured to the other of the busbar and the electronic device; and
a connector configured to flexibly secure the dynamic head and the static head so that the dynamic head is capable of moving relative to the static head,
wherein the dynamic head includes a cone-shaped annular portion and two spaced apart bars secured to the annular portion and configured to be secured to the busbar,
wherein the two spaced apart bars extend in a direction that is perpendicular to a longitudinal direction of the cone-shaped annular portion, and
wherein the spaced apart bars have openings formed therein to secure the spaced apart bars to the busbar.

3. A busbar connector assembly comprising:
a dynamic head configured to be secured to one of a busbar and an electronic device;
a static head configured to be secured to the other of the busbar and the electronic device; and
a connector configured to flexibly secure the dynamic head and the static head so that the dynamic head is capable of moving relative to the static head,
wherein the dynamic head includes a cone-shaped annular portion and two spaced apart bars secured to the annular portion and configured to be secured to the busbar, and
wherein the static head includes a cone-shaped annular portion and a connector portion configured to be secured to the electronic device.

4. The busbar connector assembly of claim 3, wherein the connector portion of the static head extends along a plane that is perpendicular to an axis of the cone-shaped annular portion.

5. The busbar connector assembly of claim 4, wherein the connector portion has openings formed therein to secure the connector portion to the electronic device.

6. The busbar connector assembly of claim 3, wherein the connector includes an adaptive connector configured to be received within the cone-shaped annular portions of the dynamic head and the static head.

7. The busbar connector assembly of claim 6, wherein the adaptive connector has a first end configured to be received within the cone-shaped annular portion of the dynamic head and a second end configured to be received within the cone-shaped annular portion of the static head.

8. The busbar connector assembly of claim 7, wherein the adaptive connector has a cutout formed therein for ventilation.

9. The busbar connector assembly of claim 7, wherein the connector further includes a spring bracket secured to the dynamic head and the adaptive connector, and a spring disposed within the spring bracket.

10. The busbar connector assembly of claim 9, wherein the spring bracket has a first portion configured to be secured to the dynamic head and a second portion configured to be secured to the adaptive connector.

11. The busbar connector assembly of claim 10, wherein the spring is disposed within a central portion of the adaptive connector and around the second portion of the spring bracket.

12. The busbar connector assembly of claim 11, further comprising two smaller brackets configured to be secured within the central portion of the adaptive connector.

13. The busbar connector assembly of claim 12, wherein one smaller bracket engages one end of the spring and the other smaller bracket engages an opposite end of the spring.

14. A method for securing an electronic device to a busbar, the method comprising:
securing a busbar connector assembly to the electronic device, the busbar connector assembly including a dynamic head, a static head configured to be secured to the electronic device, and a connector configured to flexibly secure the dynamic head and the static head; and
securing the dynamic head to the busbar, the dynamic head being capable of moving relative to the static head,
wherein securing the dynamic head to the busbar includes sliding the electronic device and the busbar connector assembly toward the busbar, and
wherein the dynamic head includes a cone-shaped annular portion and two spaced apart bars secured to the annular portion and configured to be secured to the busbar, and wherein the static head includes a cone-shaped annular portion and a connector portion configured to be secured to the electronic device.

15. The method of claim 14, wherein the connector includes an adaptive connector configured to be received within the cone-shaped annular portions of the dynamic head and the static head,
a spring bracket secured to the dynamic head and the adaptive connector, and
a spring disposed within the spring bracket.

* * * * *